United States Patent [19]

Gileta

[11] Patent Number: 5,205,303
[45] Date of Patent: Apr. 27, 1993

[54] LIQUID CLEANING PROCESS AND APPARATUS FOR CIRCUIT BOARDS AND THE LIKE

[75] Inventor: John Gileta, Chateauguay, Canada

[73] Assignee: Electrovert Ltd., La Prairie, Canada

[21] Appl. No.: 624,199

[22] Filed: Dec. 6, 1990

[51] Int. Cl.$^5$ ............................................. B08B 15/00
[52] U.S. Cl. ..................................... 134/73; 134/108; 134/114; 134/122 R
[58] Field of Search ................. 134/122 R, 64 R, 114, 134/105, 73, 108; 68/5 E, 5 D, 18 C; 34/15, 54, 61, 68, 74, 79, 36, 242

[56] References Cited

U.S. PATENT DOCUMENTS

| | | | |
|---|---|---|---|
| 1,738,947 | 12/1929 | Chapin | 68/5 E |
| 2,831,332 | 4/1958 | Ross | 68/5 E |
| 3,058,327 | 10/1962 | Hablutzel | 68/5 E |
| 4,055,971 | 11/1977 | Hermes | 68/18 C X |
| 4,145,898 | 3/1979 | Brouard et al. | 68/18 C X |
| 4,185,397 | 1/1980 | Hutzenlaub | 68/18 C X |
| 4,223,450 | 9/1980 | Rothchild | 34/36 |
| 4,648,417 | 3/1987 | Johnson et al. | 68/18 C X |
| 5,001,845 | 3/1991 | Norz et al. | 34/79 |
| 5,054,212 | 10/1991 | Ishikawa | 34/242 X |
| 5,056,457 | 10/1991 | Harada | 68/18 C X |

OTHER PUBLICATIONS

Dishart, K. T. and M. C. Wolff, Advantages and Process Options of Hydrocarbon Based Formulations in Semi-Aqueous Cleaning, pp. 513-527.

Primary Examiner—Frankie L. Stinson
Attorney, Agent, or Firm—Darby & Darby

[57] ABSTRACT

In a liquid cleaning process and apparatus where work pieces such as printed circuit boards are cleaned in an isolated enclosure, there is provided an inert gas purging system within the enclosure and a recycling condenser within the isolated enclosure to recycle all vapors from cleaning tanks within the enclosure. The apparatus has a cleaning tank and a water tank, an isolated enclosure extends between the tanks and has liquid seal dividers that extend down into the tanks. The work pieces pass on a conveyor through the cleaning tank, under a first divider, and into the enclosure where cleaning occurs. The work pieces then pass through the water tank under the second divider. A condenser is positioned above the isolated enclosure which condenses vapors rising from the enclosure and the condensate is recirculated to the cleaning tank and the water tank.

10 Claims, 1 Drawing Sheet

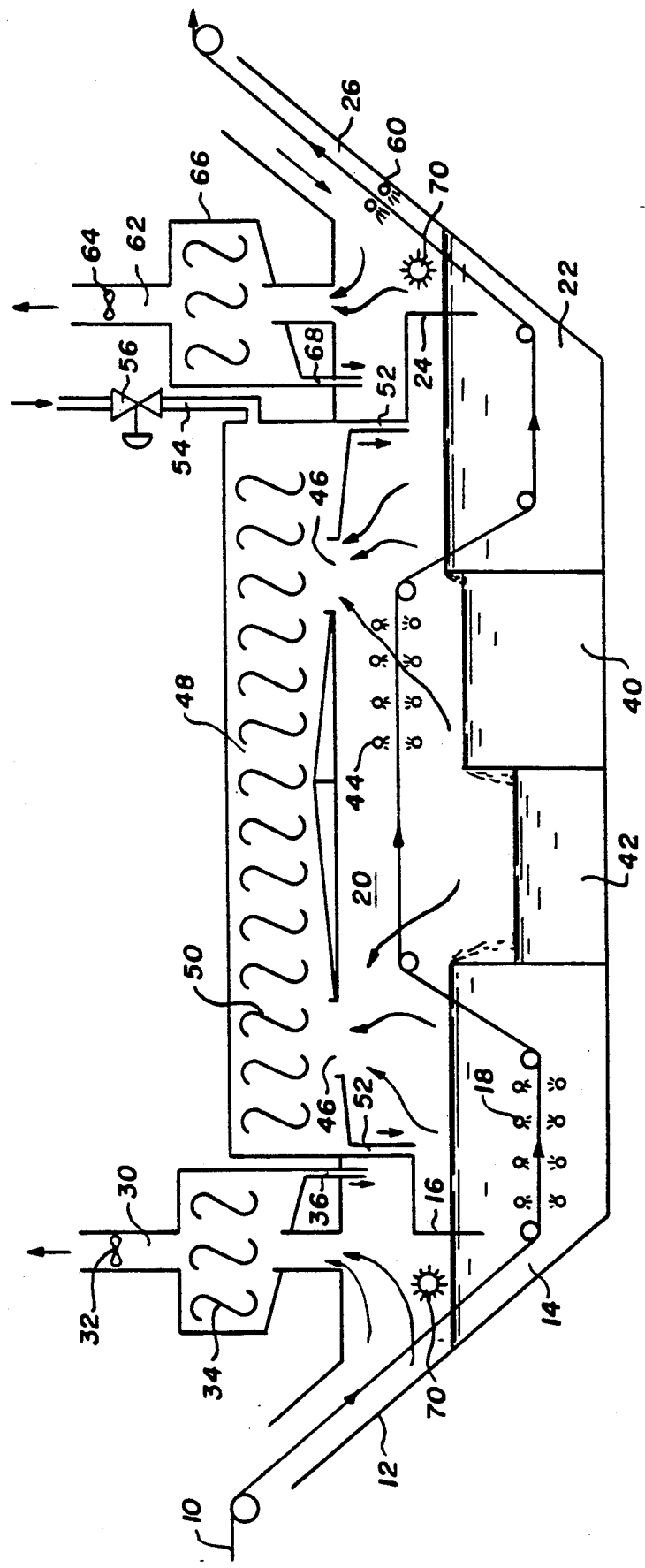

LIQUID CLEANING PROCESS AND APPARATUS FOR CIRCUIT BOARDS AND THE LIKE

BACKGROUND OF THE INVENTION

The present invention relates to liquid cleaning of work pieces such as printed circuit boards and wiring boards upon which electric components have been soldered. More specifically the present invention relates to a liquid cleaning apparatus wherein the cleaning occurs substantially within an isolated enclosure which is purged with an inert gas.

Printed circuit boards and the like that have solder deposits thereon after soldering, generally have to be cleaned to remove deposits on the solder from flux resins and the like. Many of the cleaning agents used today to remove these deposits are either flammable or explosive when sprayed in air. Thus liquid cleaning devices are used wherein work pieces are sprayed in an inert environment within an enclosure.

An example of these types of cleaning devices is shown in co-pending application Ser. No. 456,108 filed Dec. 22, 1989. A drying system for a liquid cleaning apparatus is disclosed in co-pending application Ser. No. 574,342 filed Aug. 28, 1990. Furthermore, a liquid cleaning apparatus wherein liquid cleaning agent and water are recycled in a closed loop configuration is disclosed in co-pending application Ser. No. 595,469 filed Oct. 10, 1990. In this latter case the liquid cleaning agents are reused and not dumped or discharged into a sewer or draining system.

When inert gas is provided within an enclosure of a liquid cleaning apparatus, gas and vapors are contained within the enclosed area by providing liquid seals at the entrance and exit to the enclosed area. However, it is generally necessary to withdraw the gases from the enclosed area as they contain vapors. In co-pending application Ser. No. 574,342, the inert gas containing moisture and other vapors passes through a heat exchange condenser. The liquid cleaning agent, water and any other vapors present are condensed prior to the gas either venting or being reused in a dryer tunnel where the work pieces leaving the enclosure are dried. Consequently inert gas must continually be fed into the enclosure to maintain a high percentage of inert gas therein and avoid the possibility of fire or explosion from the volatile liquid cleaning agent.

One such example of liquid cleaning agent used in the liquid cleaning devices is a terpene based solvent. In order to avoid fire or explosion, terpene based solvent is sprayed in a liquid cleaning tank beneath the surface of the liquid cleaning agent to avoid excessive vaporization of the solvent.

SUMMARY OF THE INVENTION

The present invention provides a liquid cleaning apparatus which has a totally enclosed and isolated chamber (enclosure) that does not exhaust to atmosphere. The chamber may be inerted initially utilizing an inert gas purge. After start up, cooling coils are provided in a condenser compartment associated with the chamber to condense vapors from within the chamber and returning the vapors to recirculate in the liquid cleaning apparatus. Thus, inert gas need not continuously be supplied to the liquid cleaning system as once an inert gas purge has been carried out at start up, then the chamber is sealed or isolated from the atmosphere. The vapor and steam produced from the cleaning tank, water tank and other tanks within the enclosure, rises up and contacts the condenser coils in the condensate compartment to cool and condense into a condensate which is reused in the liquid cleaning tank or in the water tank.

The present invention provides a liquid cleaning apparatus for cleaning work pieces comprising a cleaning tank for containing a liquid cleaning agent, a water tank, an isolated enclosure means extending from the cleaning tank to the water tank with a first liquid seal divider in the cleaning tank and a second liquid seal divider in the water tank, a conveyor means adapted to carry work pieces through the cleaning tank under the first liquid seal divider into the isolated enclosure means and out of the isolated enclosure means through the water tank under the second liquid seal divider, inert gas purge entry to the isolated enclosure means, and condenser means associated with the isolated enclosure means adapted to condense vapors within the isolated enclosure means and recirculate condensate to the cleaning tank and the water tank.

The present invention also provides a method for cleaning work pieces comprising the steps of conveying work pieces on a conveyor into a cleaning tank containing a liquid cleaning agent, under a first liquid seal divider and into an isolated enclosure, maintaining an inert gas atmosphere in the isolated enclosure, condensing vapor within the isolated enclosure and recirculating condensate to the cleaning tank, conveying the work pieces on the conveyor into a water tank under a second liquid seal divider and into a dryer section, and drying the work pieces in the dryer section.

The present invention also provides in a method of cleaning work pieces with a liquid cleaning agent, wherein work pieces are conveyed on a conveyor into a cleaning tank, under a first liquid seal divider into an enclosure, and from the enclosure into a water tank, under a second liquid seal divider into a dryer section to dry the work pieces, the improvement comprising the steps of isolating the enclosure and maintaining an inert gas atmosphere therein, and condensing vapor within the enclosure and recirculating condensate to the cleaning tank and the water tank.

BRIEF DESCRIPTION OF THE DRAWING

The drawing illustrates an embodiment of the invention which is a diagrammatic view of a liquid cleaning apparatus.

DETAILED DESCRIPTION OF THE INVENTION

In the drawing conveyor 10 is provided for conveying work pieces through the liquid cleaning apparatus. The conveyor enters an inlet tunnel 12, passes down into a cleaning tank 14 containing a liquid cleaning agent. The cleaning tank 14 has a first liquid seal divider 16 which extends down below the surface of the liquid within the tank 14. The position of the first liquid seal divider 16 is to maintain only the minimum surface area of the cleaning tank open to the inlet tunnel 12 consistent with allowing sufficient clearance for work pieces on the conveyor 10 to pass under the first liquid seal divider 16. The conveyor 10 passes under the first liquid seal divider 16 and has jets or sprays 18 above and below the conveyor 10 immersed within the liquid cleaning agent in the tank 14 downstream of the first liquid seal divider 16. The jets or sprays 18 spray liquid cleaning agent under pressure on both top and bottom of the work pieces.

The conveyor 10 passes out of the cleaning tank 14 into an isolated chamber 20 which is sealed and therefore not open to the atmosphere in any way. The isolated chamber 20 or the enclosure extends between the first liquid seal divider 16 and the second liquid seal divider 24. The conveyor 10 passes through the chamber 20 and passes down into a water tank 22, under a second liquid seal divider 24, which is positioned as far as possible to the right of the water tank 22 so that the larger portion of the surface area of the tank 22 is within the isolated chamber 20. The conveyor 10 exits the water tank 22 and enters a dryer section or exit tunnel 26 and then exits from the top of the tunnel 26.

In the inlet tunnel 12 an inlet exhaust duct 30 draws vapor and air by means of a fan 32 through a condenser 34. The condensesr 34 has cooling coils therein so that all vapor from the tank 14 and moisture in the air is condensed and passes down through a drain 36 back into the cleaning tank 14.

Inside the chamber 20, an intermediate tank 40 is shown adjacent the water tank 22 positioned so that water cascades from the water tank 22 into the intermediate tank 40. A cascade tank 42 positioned between the intermediate tank 40 and the cleaning tank 14 is arranged so that the liquid cleaning agent cascades from the cleaning tank 14 into the cascade tank and water from the intermediate tank 40 cascades into the cascade tank 42. High pressure water jets 44 are shown in the chamber 20 above and below the conveyor 10 positioned above the intermediate tank 40.

Vapor within the chamber 20 passes up through two openings 46 into a condenser compartment 48 having a series of cooling coils 50 therein. Condensate from the cooling coils 50 flows to two drains 52 for returning to either the cleaning tank 14 or the water tank 22. Referring to application Ser. No. 595,469, the condensate in the drains 52 may be separated into the liquid cleaning agent and water and then recirculated to the appropriate tanks. Furthermore, as also disclosed in this application, the liquid cleaning agent sprays 18 are supplied by a high pressure pump taking liquid cleaning agent from within the tank 14 and feeding it to the sprays 18. The high pressure water sprays 44 are supplied by a pump taking water from the intermediate tank 40 and feeding it through the sprays 44.

Also referring to pending application Ser. No. 595,469, liquids from the cascade tank 42 may be separated and the liquid cleaning agent returned to the cleaning tank 14, and the water returned to the water tank 22.

An inlet gas purge line 54 provides for entry of a suitable inert gas such as nitrogen into the top compartment 48. It is only necessary to purge nitrogen at the start up of operation for the liquid cleaning apparatus. Once the system is fully purged with nitrogen or other suitable inert gas then it maintains its isolated environment within the chamber 20 and no air is able to enter. A regulator valve 56 is shown on the inert gas purge line 54 to regulate a small volume of make up inert gas into the chamber 20. The valve 56 may be operated by a pressure sensor (not shown) within the chamber 20 to ensure there is not a substantial pressure drop therein.

In the dryer section 26, two heated gas jets 60, which may be air or inert gas such as nitrogen, are shown above and below the conveyor 10 to assist in drying work pieces on the conveyor 10. Gas knives may be used in place of jets. The jets 60 blow any remaining droplets of water off the work pieces back into the water tank 22. As in the entry tunnel 12 an exhaust duct 62 with an exhaust fan 64 pulls a combination of air and vapor from the exhaust tunnel 26 through an exit condenser 56 which condenses any vapors and water particles therein. The condensate flows through drain 68 either into the water tank 22 or alternatively may be separated as disclosed in co-pending application Ser. No. 595,469 and recirculated through the liquid cleaning agent tank 14 and the water tank 22.

The inlet exhaust vent 30 from the inlet tunnel 12 and the exit exhaust vent 62 from the dryer tunnel 26 draws in substantially only air. Most of the vapors and moisture are condensed in the condensers 34 and 66. Furthermore any odours that may be present from the liquid cleaning agent or from any impurities dissolved from the work pieces, is vented through the two exhaust ducts 30 and 62. Air being drawn into the inlet tunnel 12 and dryer tunnel 26.

In another embodiment, the area above the cleaning tank 14 in the inlet tunnel and the area above the water tank 22 in the exit tunnel 26, both of which are outside the isolated chamber 20 may be inerted by, for example, the application of an inert gas through outlets 70. With regard to the area above the water tank 22, the inerting may at least partially be accomplished by steam or water vapor coming off the water surface. Inert gas may be a low quality nitrogen gas, that is to say having 0.1% oxygen present which may not be suitable in the isolated chamber 20. The inert gas is constantly supplied to these exhaust areas above the cleaning tank 14 and the water tank 22 outside the isolated chamber 20 and is constantly exhausted up the exhaust ducts 30 and 62. Thus the need for a cheap inert gas supply which cannot be reused. Steam and water vapor from the water tank 22 is condensed in the exit condenser 66 and the condensate reused.

Various changes may be made to the embodiments shown herein without departing from the scope of the present invention which is limited only by the following claims.

The embodiments of the invention in which an exclusive property or privilege is claimed are defined as follows:

1. A closed system liquid cleaning apparatus for cleaning workpieces on a conveyor comprising:
   a cleaning tank at the system entrance for containing a liquid cleaning agent,
   a water tank at the system exit for holding water,
   an enclosure means isolated from the atmosphere extending between a first liquid seal divider extending into the liquid in the cleaning tank and a second liquid seal divider extending into the water in the water tank,
   a conveyor means adapted to carry work pieces thereon into and through the cleaning liquid in the cleaning tank and under the first liquid seal divider into and through the free space in the isolated enclosure means in which the cleaning liquid on the work pieces vaporizes and out of the isolated enclosure means into and through the water in the water tank and under the second liquid seal divider and out of the water tank,
   means for supplying an inert gas purge to the isolated enclosure means, and
   condenser means communicating with the interior of said isolated enclosure means and the portion of said cleaning tank and said water tank between said first and second liquid seal means and adapted to condense the cleaning liquid and water vapors within the isolated enclosure means and recirculate the condensate to the cleaning tank and the water tank.

2. The liquid cleaning apparatus according to claim 1 including an inlet tunnel to the cleaning tank for the conveyor means, and an inlet exhaust duct from the inlet tunnel having a fan means therein for extraction from the inlet tunnel.

3. The liquid cleaning apparatus according to claim 2 including an inlet condenser means in the inlet exhaust duct, adapted to condense vapors and recirculate condensate to the cleaning tank.

4. The liquid cleaning apparatus according to claim 1 including a dryer exit tunnel from the water tank for the conveyor means, and an exit exhaust duct from the dryer exit tunnel having a fan means therein for extraction from the exit tunnel.

5. The liquid cleaning apparatus according to claim 4 including an exit condenser means in the exit exhaust duct, adapted to condense vapors and recirculate condensate to the cleaning tank and the water tank.

6. The liquid cleaning apparatus according to claim 4 wherein hot air jets are provided in the dryer exit tunnel directed on each side of the conveyor means, adapted to assist in drying work pieces carried by the conveyor means.

7. The liquid cleaning apparatus according to claim 1 including a regulator valve at the inert gas entry to provide make up inert gas to the isolated enclosure means.

8. The liquid cleaning apparatus according to claim 1 wherein the second liquid seal divider divides the water tank with a minimum surface area outside the isolated enclosure means.

9. The liquid cleaning apparatus according to claim 1 wherein the condenser means comprises cooling coils contained in a condenser compartment above the enclosure means and in communication therewith.

10. The liquid cleaning apparatus according to claim 1 including inerting means to inert areas above the cleaning tank and above the water tank outside the isolated enclosure.

* * * * *